United States Patent
Barth, Jr.

(10) Patent No.: US 9,117,547 B2
(45) Date of Patent: Aug. 25, 2015

(54) REDUCED STRESS HIGH VOLTAGE WORD LINE DRIVER

(71) Applicant: International Business Machines Corporation, Armonk, NY (US)

(72) Inventor: John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/887,508

(22) Filed: May 6, 2013

(65) Prior Publication Data

US 2014/0328122 A1 Nov. 6, 2014

(51) Int. Cl.
G11C 11/24 (2006.01)
G11C 7/00 (2006.01)
G11C 5/14 (2006.01)
G11C 8/00 (2006.01)
G11C 11/408 (2006.01)

(52) U.S. Cl.
CPC .................................. G11C 11/4085 (2013.01)

(58) Field of Classification Search
CPC ........................................................ G11C 8/08
USPC ............... 365/182, 230.06, 149, 189.11, 226; 327/108
See application file for complete search history.

(56) References Cited

U.S. PATENT DOCUMENTS

| | | | |
|---|---|---|---|
| 5,406,147 A * | 4/1995 | Coyle et al. | 327/51 |
| 5,534,811 A | 7/1996 | Gist et al. | |
| 5,650,733 A | 7/1997 | Covino | |
| 5,726,589 A | 3/1998 | Cahill et al. | |
| 5,748,556 A | 5/1998 | Iyengar | |
| 6,141,200 A | 10/2000 | Hinedi et al. | |
| 6,343,044 B1 | 1/2002 | Hsu et al. | |
| 6,373,753 B1 | 4/2002 | Proebsting | |
| 6,535,430 B2 | 3/2003 | Ogura et al. | |
| 6,643,110 B2 | 11/2003 | Allen | |
| 6,693,469 B2 | 2/2004 | Prodanov | |
| 6,760,381 B2 | 7/2004 | Lu | |
| 6,795,328 B2 * | 9/2004 | Kato et al. | 365/230.06 |
| 7,038,937 B2 | 5/2006 | Lines | |
| 7,199,612 B2 | 4/2007 | Oertle et al. | |
| 7,277,315 B2 | 10/2007 | Yuan et al. | |
| 7,372,739 B2 | 5/2008 | Macerola | |
| 7,447,105 B2 | 11/2008 | Lee | |
| 7,701,263 B2 | 4/2010 | Kumar et al. | |
| 7,746,125 B2 | 6/2010 | Storms et al. | |
| 8,120,968 B2 * | 2/2012 | Reohr et al. | 365/189.11 |
| 8,605,489 B2 * | 12/2013 | Reohr et al. | 365/149 |

(Continued)

OTHER PUBLICATIONS

FOSS, "Application of a High-Voltage Pumped Supply for Low-Power DRAM", MOSAID Technologies Incorporated, 1992 Symposium on VLSI Circuits Digest of Technical Papers, 92CH3173-2/92/0000-0104, copyright 1992 IEEE.

*Primary Examiner* — Trong Phan
(74) *Attorney, Agent, or Firm* — Isaac J. Gooshaw

(57) ABSTRACT

Exemplary embodiments of the present invention disclose a method and system for asserting a voltage transition from a low voltage to a high voltage with a voltage difference between the low and high voltages on a word line with a word line driver logic that is composed of thin-oxide MOS transistors, wherein the thin-oxide MOS transistors experience less than the voltage difference on the word line between any two of a source, a drain, and a gate. In a step, charging the word line from the low voltage to an intermediate voltage level. In another step, charging the word line to the high voltage from the intermediate voltage level.

19 Claims, 3 Drawing Sheets

(56) References Cited

U.S. PATENT DOCUMENTS

| | | |
|---|---|---|
| 2001/0020840 A1* | 9/2001 | Kojima .................... 323/282 |
| 2002/0186058 A1* | 12/2002 | Prodanov ................ 327/108 |
| 2003/0112041 A1 | 6/2003 | Clark et al. |
| 2004/0212014 A1* | 10/2004 | Fujito et al. .............. 257/355 |
| 2007/0086248 A1 | 4/2007 | Daga |
| 2008/0056021 A1 | 3/2008 | Kobayashi |
| 2009/0243665 A1* | 10/2009 | Kumar et al. ............. 327/108 |
| 2011/0149673 A1* | 6/2011 | Sim ..................... 365/230.03 |
| 2011/0199837 A1* | 8/2011 | Reohr et al. ......... 365/189.06 |
| 2013/0170313 A1* | 7/2013 | Earle et al. .......... 365/230.06 |

\* cited by examiner

REDUCED STRESS HIGH VOLTAGE WORD LINE DRIVER

FIELD OF THE INVENTION

The present invention relates generally to the design of memory and more specifically to the design of word line drivers for semiconductor memory.

BACKGROUND

Semiconductor memory typically includes a memory array comprising a plurality of memory cells coupled to an arrangement of word lines and bit lines, each memory cell being coupled to a corresponding unique word line and bit line pair. There may be a plurality of memory cells coupled to a given word line and/or a given bit line. A term "word line" as used in a description of a memory array is sometimes referred to as a "row." Similarly, a term "bit line" in a memory array description is sometimes referred to as a "column." The terms "word line" and "bit line" as used herein are intended to have a same meaning as, and may therefore be used interchangeably with, the terms "row" and "column," respectively.

A word line driver logic is typically coupled to each word line in a semiconductor memory. Within a memory array, one word line is typically activated (i.e., in an active mode) at a given time to access (e.g., read, write or refresh) memory cells coupled to an activated word line. At that time, other word lines in the memory array remain inactive (i.e., in a standby mode). A voltage on an activated word line is controlled by a word line driver coupled to the activated word line. Deactivated word lines are each held at a standby voltage level by corresponding word line driver coupled to the deactivated word lines. A selection of an active word line is determined by a word line address signal supplied to a word line decoder in a memory array. A word line decoder selectively activates a word line driver coupled to an addressed word line. A design and operation of conventional memory arrays and conventional semiconductor memory is well known in the art.

It is often desirable, particularly in a dynamic random access memory (DRAM), to apply a higher voltage to a memory cell when writing the cell to a logic high state. A use of higher write voltages advantageously enables the memory cell to store more charge or, in other words, more signal. With more signal, various combinations of improvements in memory capacity (i.e., density), latency, cycle time, and retention time, etc., may be realized. Unfortunately, higher voltages applied to memory cells can damage transistors associated with these cells over time. For this reason, reliability limitations are specified for field-effect transistors (FETs) in order to constrain voltages across source-to-drain regions and gate-to-source/drain regions so that these transistors, operated under such constraints, will not experience breakdown during an operable lifetime. These reliability constraints, however, limit conventional semiconductor memory from achieving the above-stated benefits of using higher word line voltages.

SUMMARY

Exemplary embodiments of the present invention disclose a system and a method for asserting a voltage transition from a low voltage to a high voltage with a voltage difference between the low and high voltages on a word line with a word line driver logic that is composed of thin-oxide MOS transistors, wherein the thin-oxide MOS transistors experience less than the voltage difference on the word line between any two of a source, a drain, and a gate. In a step, charging the word line from the low voltage to an intermediate voltage level. In another step, charging the word line from the intermediate voltage to the high voltage.

DETAILED DESCRIPTION

Figure 1:
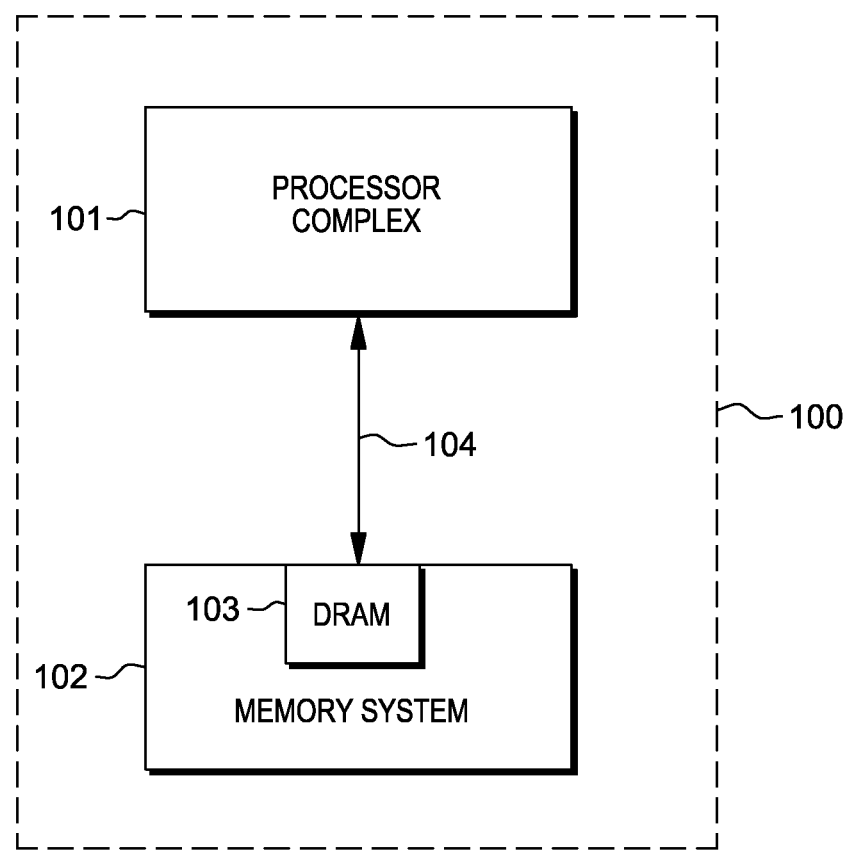
FIG. 1 is a block diagram showing a computer system with a processor complex and a memory system.

Exemplary embodiments of the present invention are described herein using an illustrative embodiment of a memory word line driver logic suitable for use in a DRAM. However the invention is not limited to a specific apparatus and methods illustratively shown and described herein. Rather, aspects of the invention are directed broadly to techniques for overcoming breakdown voltage limitations in a word line driver logic by reducing peak voltages across one or more transistors in an output stage of the word line driver logic. In this manner, aspects of the invention facilitate a use of voltages generated by the word line driver logic, and applied to corresponding word lines in a memory logic, that are higher than can otherwise be tolerated by individual transistors in a driver logic without incurring damage or impacting reliability. Those skilled in the art, given a teaching herein, understand that numerous modifications can be made to an embodiment shown that are within a scope of the present invention. That is, no limitations with respect to a specific embodiments described herein are intended or should be inferred.

Standard IC fabrication technologies generally provide at least two different types of transistors. Input/output (I/O) transistors are an example of a first type. I/O transistors are designed to operate in a relatively high voltage environment, such as, for example, a 1.7-volt (V) nominal environment. In order to withstand the relatively high voltage without gate oxide breakdown, I/O transistors are formed having a relatively thick gate oxide, such as, for example, greater than about 25 angstroms thick and relatively long channel lengths (e.g., about twice a length of thin-oxide transistors). Therefore, a first type of transistor, which is able to withstand relatively high voltages and has relatively thick gate oxide, may be referred to herein as a "thick-oxide transistor" or "thick-oxide FET."

Alternatively, logic transistors are an example of a second type of transistor provided in standard IC fabrication technologies. Logic transistors are designed to operate in a lower voltage environment, such as, for example, a 1.0-volt nominal environment. Because a voltage applied to these transistors is lower than a voltage applied to a thick-oxide transistor, a gate oxide of logic transistors does not need to be as thick compared to a gate oxide of a thick-oxide device. For example, a gate oxide thickness of a typical logic transistor may be only about 10 to 12 angstroms and a channel length short (e.g., at a minimum specified lithographic dimension). Therefore, a second type of transistor, which is able to withstand only relatively low voltages and has relatively thin gate oxide, may be referred to herein as a "thin-oxide transistor" or "thin-oxide FET." Note, that a thin-oxide transistor is generally used in embedded semiconductor memories, for example, in embedded SRAM and DRAM memory.

As is well known by those skilled in the art, a FET comprises a source, a drain and a gate. A FET is non-conductive or "off" (i.e., in an off state) when a magnitude of a gate-to-source voltage (VGS) of the FET is less than a threshold voltage (VT) of the FET, so that there is essentially no active conduction (i.e., active current flow) in a channel region established between a source and drain of the FET. A FET is conductive or "on" (i.e., in an on state) when the magnitude of the gate-to-source voltage of the FET is equal to or greater than a threshold voltage of the FET, so that there is active conduction between a source and drain of the FET. A FET may additionally, but not necessarily, have a typically small, but measurable, sub-threshold or leakage current flowing between a source and drain of the FET when the FET is biased in the off state.

Because of a thicker gate oxide, thick-oxide transistors generally have less gain and are therefore significantly slower in charging up a given capacitance to a prescribed voltage level compared to thin-oxide transistors. Therefore, at least from a speed perspective, thin-oxide transistors rather than thick-oxide transistors are preferred wherever possible in a DRAM design.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," "logic," or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products not shown according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks. An exemplary embodiment of the present invention is now described in detail with reference to the figures.

FIG. 1 depicts computer system 100 in which processor complex 101 is connected to memory system 102 via data bus 104. Processor complex 101 stores and retrieves data from memory system 102 as needed. Exemplary embodiments of memory system 102 include dynamic random access memory (DRAM) 103 in which information is stored and retrieved.

Figure 2:
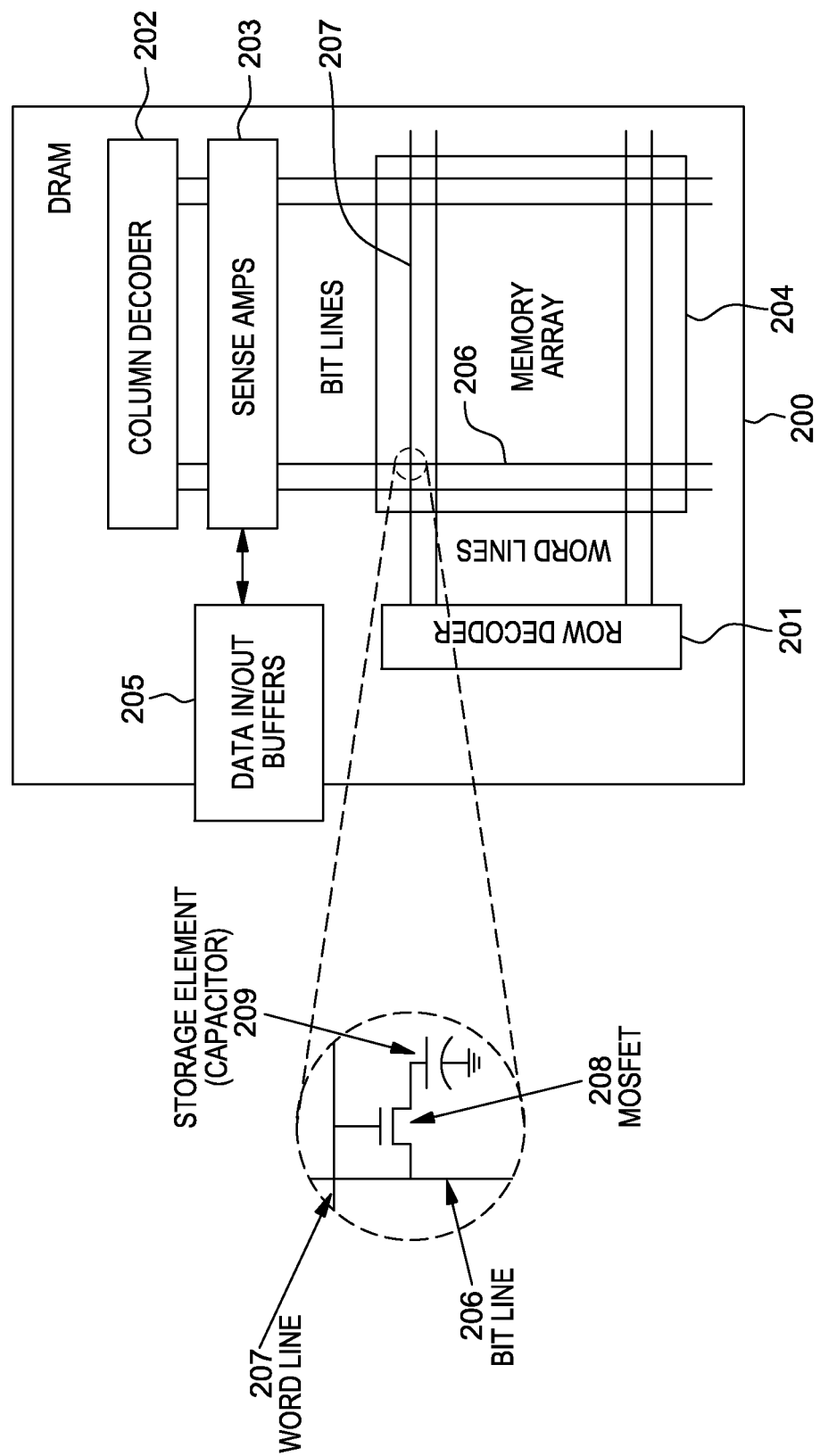
FIG. 2 is a block diagram showing functional units in an exemplary embodiment of a dynamic random access memory.

FIG. 2 depicts a block diagram of DRAM 200 in which an array of storage elements, memory array 204, stores information that is accessed by decoding address bits that are supplied to DRAM 200 by processor complex 101 when information in DRAM 200 is accessed by processor complex 101. In exemplary embodiments, DRAM 200 may be equivalent to DRAM 103, or may be DRAM 103. Row decoder 201 and column decoder 202 decode address bits supplied to DRAM 200 to select one or more storage elements in memory array 204 to read or write by selecting a row of storage elements and one or more columns of storage elements respectively. Only storage elements that are both in a selected row and in a selected column are selected. Active word line voltage is a voltage on a word line that causes one or more storage elements to be read or written. Row decoder 201 selects a row of one or more storage elements by asserting a pulse of active word line voltage on a word line that is connected to each of the one or more storage elements in the row. Each storage element is connected to a bit line or a bit line pair that conveys a bit of information into or out of a storage element when the storage element is selected. A storage element is a capacitor that can be written or read with a bit of information by placing a charge onto or detecting a charge on the capacitor respectively. For example, a charge on storage element 209 (a capacitor) is discharged onto bit line 206 through MOSFET access transistor 208 if MOSFET access transistor 208 is conditioned to conduct by an assertion of an active word line voltage pulse on word line 207 by row decoder 201. Sense amplifiers 203 detect a presence or absence of a charge on a bit line, providing for a reading of bits from selected storage elements, and data in/out buffers 205 provide for an input and output of data from DRAM 200. Similarly storage element 209 may be charged to a logic "1", i.e., written with a logic "1" by asserting a positive voltage on bit line 206 and then enabling a charge of a positive voltage to be conducted through MOSFET access transistor 208 from bit line 206 to storage element 209. A conduction of MOSFET access transistor 208 is enabled by an assertion of an active word line voltage pulse on word line 207 and thus on a gate of MOSFET access transistor 208 by row decoder 201.

Figure 3:
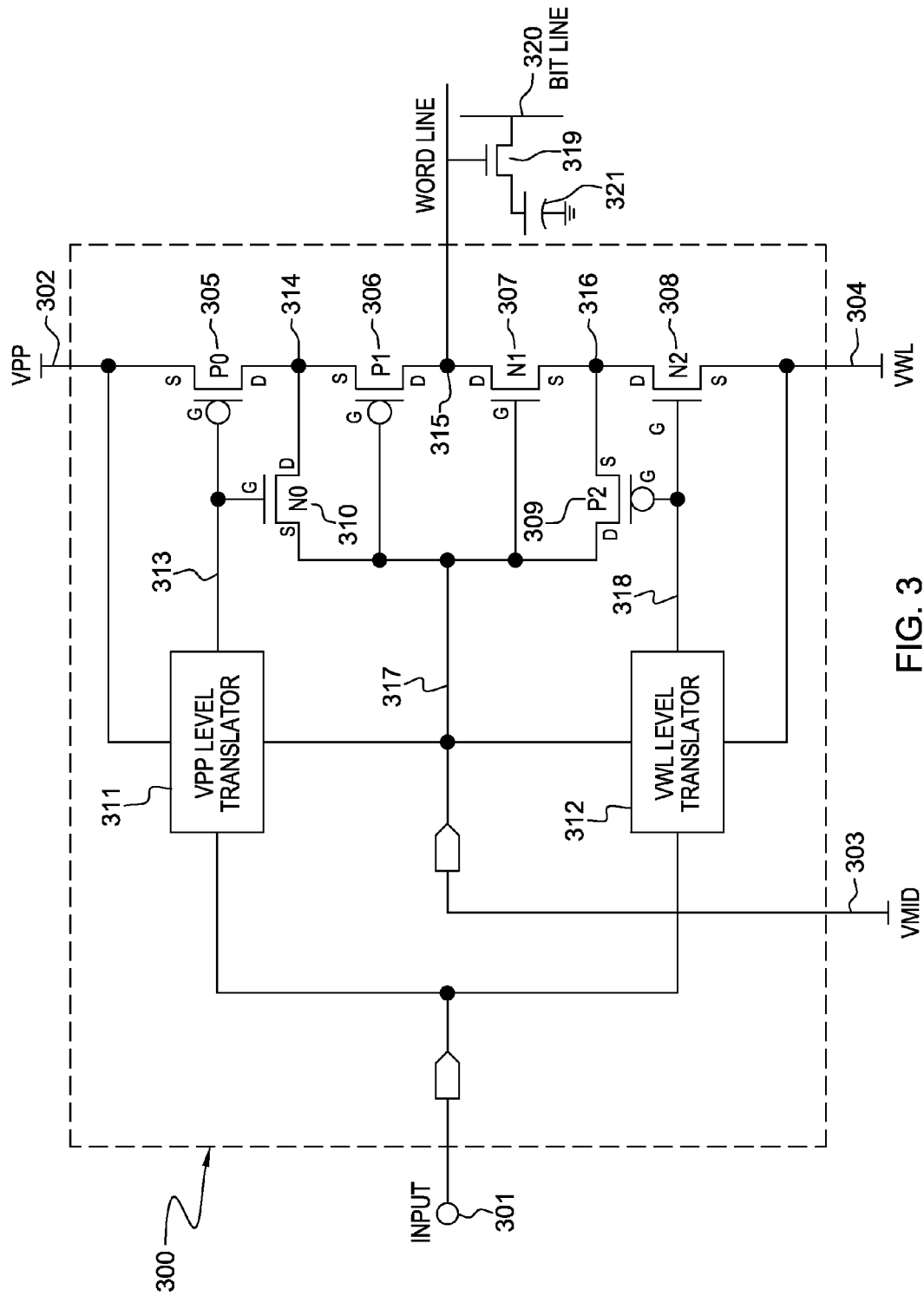
FIG. 3 shows logic in an exemplary embodiment of a reduced stress high voltage word line driver.

Row decoder 201 generates an active word line voltage pulse on a selected word line with a word line driver, and incorporates at least one word line driver for each word line. An example of a word line diver 300 is depicted in FIG. 3. Word line driver 300 accepts a positive voltage pulse on input 301. In an exemplary embodiment, word line driver 300 accepts an input voltage pulse on input 301 that begins at a positive voltage (Vdd), decreases to a ground potential for a duration, and then returns to Vdd, and responsive to the input voltage pulse generates an output positive voltage pulse that begins at a potential below ground (Vwl), rises to a positive potential (Vpp) above Vdd for a duration and returns to Vwl on word line 315. A potential difference between Vpp and Vwl is greater than a potential difference between Vdd and ground enables more charge to be stored on storage element 319 than if a potential difference between Vpp and Vwl equaled a potential difference between Vdd and ground. In exemplary embodiments, Vwl is a negative voltage. A negative voltage Vwl reduces a leakage current of access MOSFET 319, thus increasing a time duration that a charge remains on storage element 321, by decreasing a leaking of the charge through access MOSFET 319 to bit line 320. High voltage Vpp on word line 315 overcomes a voltage drop between a source and a drain of MOSFET access transistor 319, an NMOS type transistor, enabling more charge to be stored on storage element 321.

In exemplary embodiments, word line driver 300 is supplied by three voltage levels, Vpp 302, Vmid 303, and Vwl 304 and includes thin-oxide NMOS transistors 307, 308, and 310, thin-oxide PMOS transistors 305, 306, and 309 and two voltage level translators, Vpp level translator 311 and Vwl level translator 312. Vpp is at a higher potential than Vmid which is at a higher potential than Vwl. In exemplary embodiments, Vmid is about half way between Vpp and Vwl to decrease a magnitude of a voltage on transistors 305, 306, 307, 308, 309, and 310. A magnitude of a voltage between any two of gate, source and drain of a transistor is called a voltage stress on the transistor.

Vpp voltage level translator 311 accepts a voltage level between ground and Vdd as input, and outputs a corresponding voltage between Vmid and Vpp. Ground on input 301 results in Vpp voltage level translator asserting Vmid on signal line 313 and Vdd on input 301 results in Vpp voltage level translator asserting Vpp on signal line 313. Vwl voltage level translator 312 accepts a voltage level between ground and Vdd as input and outputs a voltage between Vwl and Vpp. Ground on input 301 results in Vwl voltage level translator asserting Vwl on signal line 318, and Vdd on input 301 results in Vwl voltage level translator asserting Vmid on signal line 318.

A logic of word line driver 300 prevents an augmented voltage range on word line 315 from causing a potentially damaging voltage between a gate and a source, a gate and a drain, and a source and a drain of a thin oxide layer transistor in word line driver 300. The potentially damaging voltage may decrease a reliability and useful life of DRAM 200.

An input voltage falling to ground asserted at a time t on input 301 results in Vwl being quickly asserted on signal line 318 because Vwl level translator 312 responds quickly to a falling input. Vwl on signal line 318 causes NMOS transistor 308 to not conduct and for PMOS transistor 309 to conduct. When PMOS transistor 309 conducts, Vmid is asserted on signal line 316. Vmid on signal line 317 causes NMOS transistor 307 to conduct, causing Vmid on signal line 316 to be asserted on word line 315, raising a voltage on word line 315 to Vmid minus a threshold voltage of NMOS transistor 307. When the input voltage falling to ground is asserted at the time t on input 301, Vmid is asserted at time t plus a delay on signal line 313 by Vpp level translator 311, causing NMOS transistor 310 to not conduct and causing PMOS transistor 305 to conduct. Vpp level translator 311 responds slowly to a falling input causing the delay. The delay is introduced by Vpp level translator 311 to decrease voltage stress on transistors in word line driver 300. When PMOS transistor 305 conducts, Vpp is asserted on signal line 314, causing PMOS transistor 306 to conduct. When PMOS transistor 306 conducts, Vpp is asserted on word line 315, further increasing a voltage on word line 315 from Vmid to Vpp. Therefore word line 315 transitioned from Vwl to Vpp in two stages of voltage change over time: first from Vwl to Vmid, and then from Vmid to Vpp. A timing of a voltage transition in the two stages of voltage change decreases voltage stress on a transistor in word line driver 300, extending operational lifespan of the transistor and increasing a reliability of a memory within which the transistor operates.

An input voltage rising to Vdd at a time t on input 301 results in Vpp being quickly asserted by Vpp translator 311 on signal line 313 causing NMOS transistor 310 to conduct and PMOS transistor 305 to not conduct. Vpp translator 311 responds quickly to a rising input. Vmid is now asserted on the source of PMOS transistor 306 causing it to conduct, thereby asserting Vmid on word line 315. When the input voltage rising to Vdd at time t is asserted on input 301, Vmid is asserted by Vwl translator 312 at the time t plus a delay on signal line 318 which causes NMOS transistor 308 to conduct during the delay, causing Vwl to be asserted on signal line 316. Vwl translator 312 responds slowly to a rising input.

Since Vwl is on a source of NMOS transistor 307 and Vmid is on a gate of NMOS transistor 307, NMOS transistor 307 conducts and Vwl is asserted on word line 315 after the delay. Therefore word line 315 transitioned from Vpp to Vwl in two stages of voltage change over time: first from Vpp to Vmid and then from Vmid to Vwl. A timing of a voltage transition in the two stages of voltage change decreases voltage stress on a transistor in word line driver 300, extending operational lifespan of the transistor and increasing a reliability of a memory within which the transistor operates.

An integrated logic or circuit in accordance with techniques of the present invention can be employed in conjunction with essentially any apparatus, application and/or electronic system which utilizes memory, particularly DRAM, either embedded or discrete. Suitable systems for implementing the invention may include, but are not limited to, personal computers, communication networks, electronic commerce systems, portable communications devices (e.g., cell phones), solid-state media storage devices, etc. Systems incorporating such integrated logics and circuits are considered part of the present invention.

Although illustrative embodiments of the present invention have been described herein with reference to accompanying drawings, one should understand that the invention is not limited to those precise embodiments, and that various other changes and modifications may be made therein by those skilled in the art without departing from a scope of an appended claim.

What is claimed is:

1. A word line driver logic adapted for connection to a corresponding word line in a memory logic, the word line driver logic comprising:
   a first transistor including a first source/drain coupled to a first voltage supply providing a first voltage level, a second source/drain, and a gate adapted to receive a control signal which varies as a function of an input signal supplied to the word line driver logic;
   a second transistor including a first source/drain connected to the second source/drain of the first transistor, a second source/drain coupled to the corresponding word line, and a gate coupled to a second voltage supply providing a second voltage level;
   a third transistor including a first source/drain coupled to the corresponding word line, a second source/drain, and a gate coupled to the second voltage level;
   a fourth transistor including a first source/drain connected to the second source/drain of the third transistor, a second source/drain coupled to a third voltage supply providing a third voltage level, and a gate adapted to receive a second control signal which varies as a function of the input signal;
   a fifth transistor including a first source/drain connected to the second source/drain of the first transistor, a second source/drain coupled the second voltage level, and a gate coupled to the gate of the first transistor; and
   a sixth transistor including a first source/drain connected to the second source/drain of the third transistor, a second source/drain coupled the second voltage level, and a gate coupled to the gate of the fourth transistor;
   wherein the second voltage level is configured such that a voltage difference between the first and second source/drains of the first transistor and the fourth transistor is less than a voltage difference between the first and third voltage supplies.

2. The word line driver logic of claim 1, wherein each of the first, second, third, fourth, fifth and sixth transistors is a thin-oxide MOS transistor.

3. The word line driver logic of claim 1, wherein each of the first, second and sixth transistors is a thin-oxide PMOS transistor, and each of the third, fourth and fifth transistors is a thin-oxide NMOS transistor.

4. The word line driver logic of claim 1, wherein the first voltage level is higher than the second and third voltage levels, and wherein the second voltage level is higher than the third voltage level.

5. The word line driver logic of claim 1, further comprising at least one of:
   a first voltage level shifter logic coupled to the gates of the first transistor and the fifth transistor, the first voltage level shifter logic being operative to receive the input signal referenced to a first set of signal levels and to generate the control signal referenced to a second set of signal levels; and
   a second voltage level shifter logic coupled to the gates of the fourth transistor and the sixth transistor, the second voltage level shifter logic being operative to receive the input signal referenced to the first set of signal levels and to generate the second control signal referenced to a third set of signal levels.

6. The word line driver logic of claim 1, wherein the memory logic is a DRAM.

7. A method for asserting a voltage transition from a low voltage to a high voltage with a voltage difference between the low and high voltages on a word line in a memory logic with a word line driver logic that is composed of thin-oxide MOS transistors, wherein the thin-oxide MOS transistors experience less than the voltage difference on the word line between any two of a source, a drain, and a gate, the method comprising the steps of:
   charging the word line from the low voltage to an intermediate voltage that is higher than the low voltage and lower than the high voltage when transitioning the word line from the low voltage to the high voltage; and
   charging the word line to the high voltage from the intermediate voltage when transitioning the word line from the low voltage to the high voltage;
   discharging the word line from the high voltage to the intermediate voltage when transitioning the word line from the high voltage to the low voltage; and
   discharging the word line from the intermediate voltage to the low voltage when transitioning the word line from the low voltage to the high voltage.

8. The method of claim 7, wherein the thin-oxide transistors are three PMOS and three NMOS thin-oxide transistors.

9. The method of claim 7, wherein the memory logic is a DRAM.

10. The method of claim 7, wherein the low voltage is a negative voltage and the intermediate voltage is half way between the low voltage and the high voltage.

11. The method of claim 7, wherein the word driver logic is supplied with at least three voltage levels, the low voltage level, the intermediate voltage level, and the high voltage level.

12. The method of claim 7, wherein the word line logic includes a first voltage level shifter logic being operative to receive an input signal referenced to a first set of signal levels and to generate a control signal referenced to a second set of signal levels and a second voltage level shifter logic being operative to receive the input signal referenced to the first set of signal levels and to generate a second control signal referenced to a third set of signal levels.

13. The method of claim 12, wherein the first voltage level shifter responds quickly to a rising input and slowly to a falling input and the second voltage shifter responds quickly to a falling input and slowly to a rising input.

14. The method of claim 13, wherein there is a delay between the charging of the word line to the intermediate voltage step and the charging of the word line to the high voltage step and a delay between the discharging of the word line to the intermediate voltage step and the discharging of the word line to the low voltage step.

15. A 2X voltage driver logic adapted for 2X voltage output, 2X being a voltage that is twice a voltage limit of a thin oxide MOSFET device, the 2X voltage driver logic comprising:
- a first transistor including a first source/drain coupled to a first voltage supply providing a first voltage level, a second source/drain, and a gate adapted to receive a control signal which varies as a function of an input signal supplied to the 2X voltage driver logic;
- a second transistor including a first source/drain connected to the second source/drain of the first transistor, a second source/drain coupled to the corresponding 2X voltage output, and a gate coupled to a second voltage supply providing a second voltage level;
- a third transistor including a first source/drain coupled to the corresponding 2X voltage output, a second source/drain, and a gate coupled to the second voltage level;
- a fourth transistor including a first source/drain connected to the second source/drain of the third transistor, a second source/drain coupled to a third voltage supply providing a third voltage level, and a gate adapted to receive a second control signal which varies as a function of the input signal;
- a fifth transistor including a first source/drain connected to the second source/drain of the first transistor, a second source/drain coupled the second voltage level, and a gate coupled to the gate of the first transistor; and
- a sixth transistor including a first source/drain connected to the second source/drain of the third transistor, a second source/drain coupled the second voltage level, and a gate coupled to the gate of the fourth transistor;
- wherein the second voltage level is configured such that a voltage difference between the first and second source/drains of the first transistor and the fourth transistor is less than a voltage difference between the first and third voltage supplies.

16. The 2X voltage driver logic of claim 15, wherein each of the first, second, third, fourth, fifth and sixth transistors is a thin-oxide MOS transistor.

17. The 2X voltage driver logic of claim 15, wherein each of the first, second and sixth transistors is a thin-oxide PMOS transistor, and each of the third, fourth and fifth transistors is a thin-oxide NMOS transistor.

18. The 2X voltage driver logic of claim 15, wherein the first voltage level is higher than the second and third voltage levels, and wherein the second voltage level is higher than the third voltage level.

19. The 2X voltage driver logic of claim 15, further comprising at least one of:
- a first voltage level shifter logic coupled to the gates of the first transistor and the fifth transistor, the first voltage level shifter logic being operative to receive the input signal referenced to a first set of signal levels and to generate the control signal referenced to a second set of signal levels; and
- a second voltage level shifter logic coupled to the gates of the fourth transistor and the sixth transistor, the second voltage level shifter logic being operative to receive the input signal referenced to the first set of signal levels and to generate the second control signal referenced to a third set of signal levels.

* * * * *